United States Patent
Sung et al.

(10) Patent No.: US 8,367,545 B2
(45) Date of Patent: Feb. 5, 2013

(54) SYSTEM AND METHOD FOR MONITORING COPPER BARRIER LAYER PRECLEAN PROCESS

(75) Inventors: Kuo-Liang Sung, Toufen Township, Miaoli County (TW); Cheng-Hui Weng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/115,563

(22) Filed: May 25, 2011

(65) Prior Publication Data
US 2012/0299184 A1   Nov. 29, 2012

(51) Int. Cl.
*H01L 21/44* (2006.01)
*H01L 21/00* (2006.01)
*H01L 21/38* (2006.01)
*H01L 21/768* (2006.01)

(52) U.S. Cl. .. 438/672; 438/906; 438/653; 257/E21.584

(58) Field of Classification Search .................. 438/672, 438/906, 653; 257/E21.584
See application file for complete search history.

(56) References Cited

U.S. PATENT DOCUMENTS

| | | | |
|---|---|---|---|
| 6,723,639 B1* | 4/2004 | Liu et al. ...................... | 438/672 |
| 2006/0145292 A1* | 7/2006 | Park ............................. | 257/530 |
| 2010/0099251 A1* | 4/2010 | Fu et al. ...................... | 438/653 |

OTHER PUBLICATIONS

Author Unknown, "Endura Cubs RFX PVD", Applied Materials, www.appliedmaterials.com/technologies/library/endura-cub-rfx-pvd, printed May 19, 2011, 1 page.
Author Unknown, "New Product: Applied Endura CuBS PreClean System Preserves Integrity of Ultra-Low K Films", www.fabtech.org/lib/printable/1498, printed May 19, 2011, 2 pages.
Author Unknown, "Applied AKTIV Preclean" (Enabling Technology for Cu Metallization and Ultra Low k Dielectrics), Applied Materials, 3 pages.

* cited by examiner

*Primary Examiner* — Luan C Thai
(74) *Attorney, Agent, or Firm* — Haynes and Boone, LLP

(57) ABSTRACT

A monitor wafer for use in monitoring a preclean process and method of making same are described. One embodiment is a monitor wafer comprising a silicon base layer; a capping layer disposed on the silicon base layer; and a barrier layer disposed on the USG layer. The monitor wafer further comprises a copper ("Cu") seed layer disposed on the barrier layer; and a thick Cu layer disposed on the Cu seed layer.

20 Claims, 7 Drawing Sheets

SYSTEM AND METHOD FOR MONITORING COPPER BARRIER LAYER PRECLEAN PROCESS

BACKGROUND

The Aktiv™ Preclean ("APC") chamber is a significant feature of the Endura CuBS (copper barrier/seed) system available from Applied Materials, Inc., and provides a benign and efficient cleaning process for removal of polymeric residues and reaction of copper oxide ("CuO") for copper low-k interconnect process schemes for 28 nm generation and below nodes. In particular, APC is designed to effectively remove polymeric residues and reduce CuO deposits while preserving the integrity of porous low and ultra-low k inter-level dielectric ("ILD") films.

While APC is an essential process for 28 nm generation and below nodes, there is currently no suitable methodology for monitoring the CuO etch rate, and therefore monitoring the efficacy, thereof.

Therefore, what is needed is an acceptable thermal oxide etch rate monitor for an APC process.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 4:
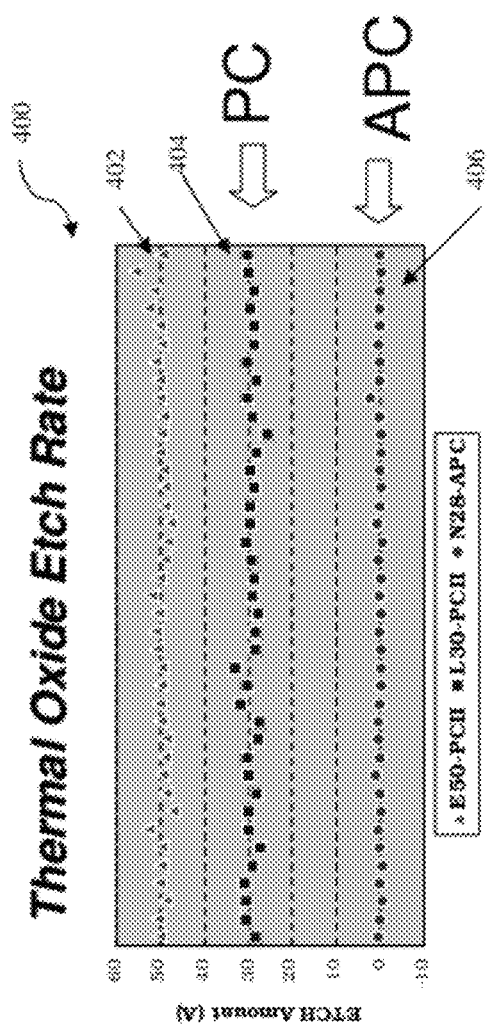
FIG. 4 illustrates a graph showing thermal oxide etch rate over time for preclean systems such as those illustrated in FIGS. 2 and 3 using the etch rate monitor wafer such as that illustrated in FIG. 1.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
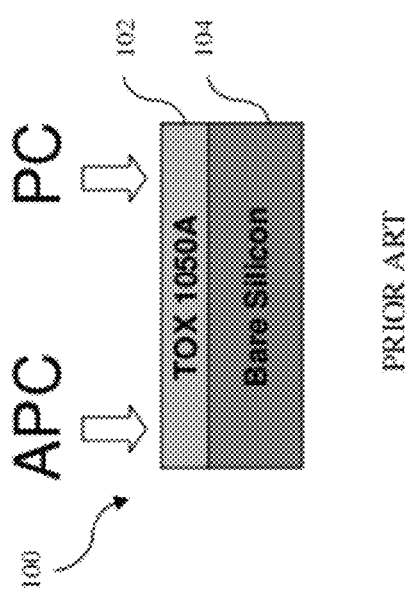
FIG. 1 illustrates a thermal oxide etch rate monitor wafer.
Figure 2:
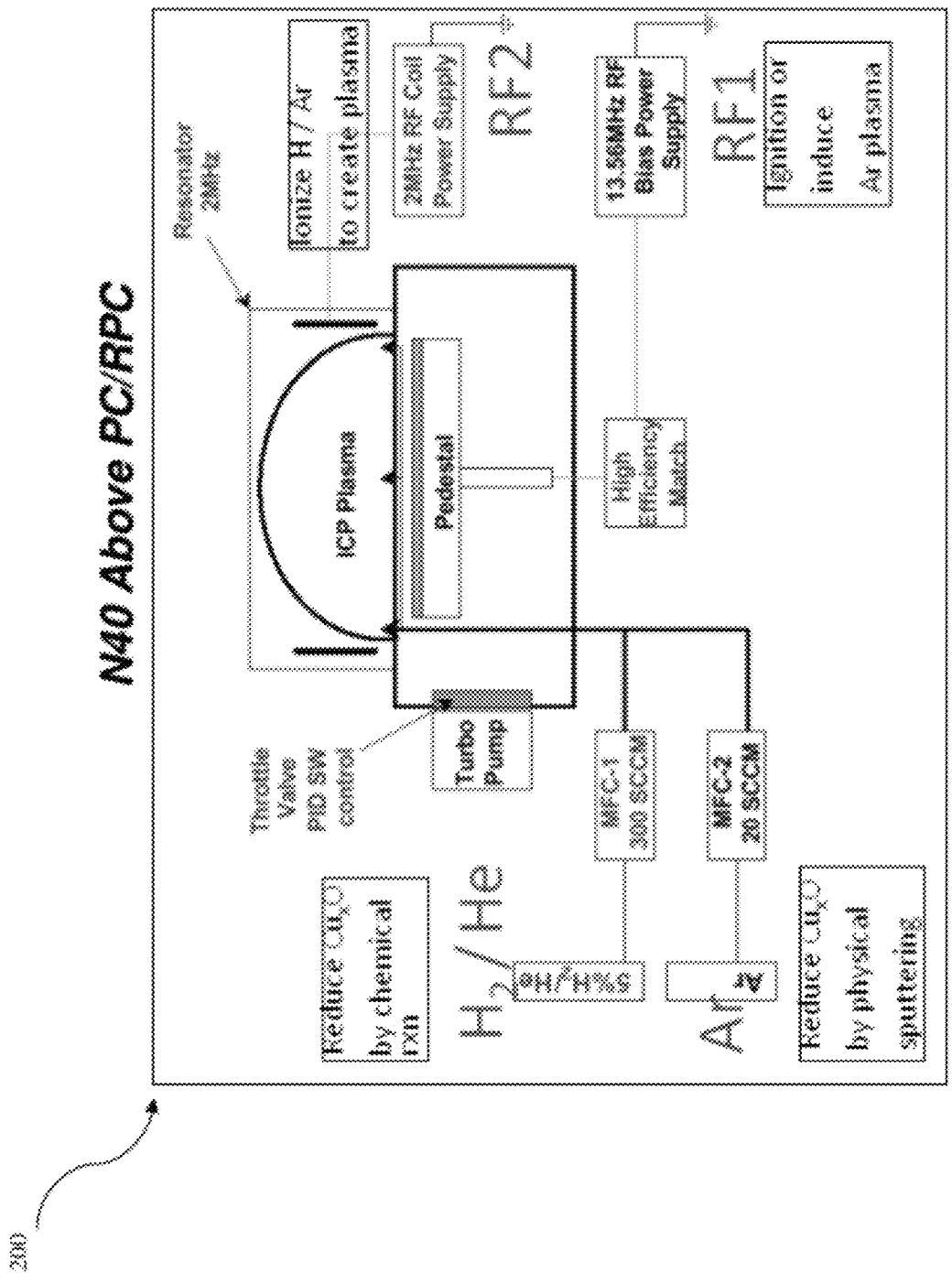
FIG. 2 illustrates a reactive plasma clean (RPC) preclean system for use in connection with 40 nm generation and above nodes.
Figure 3:
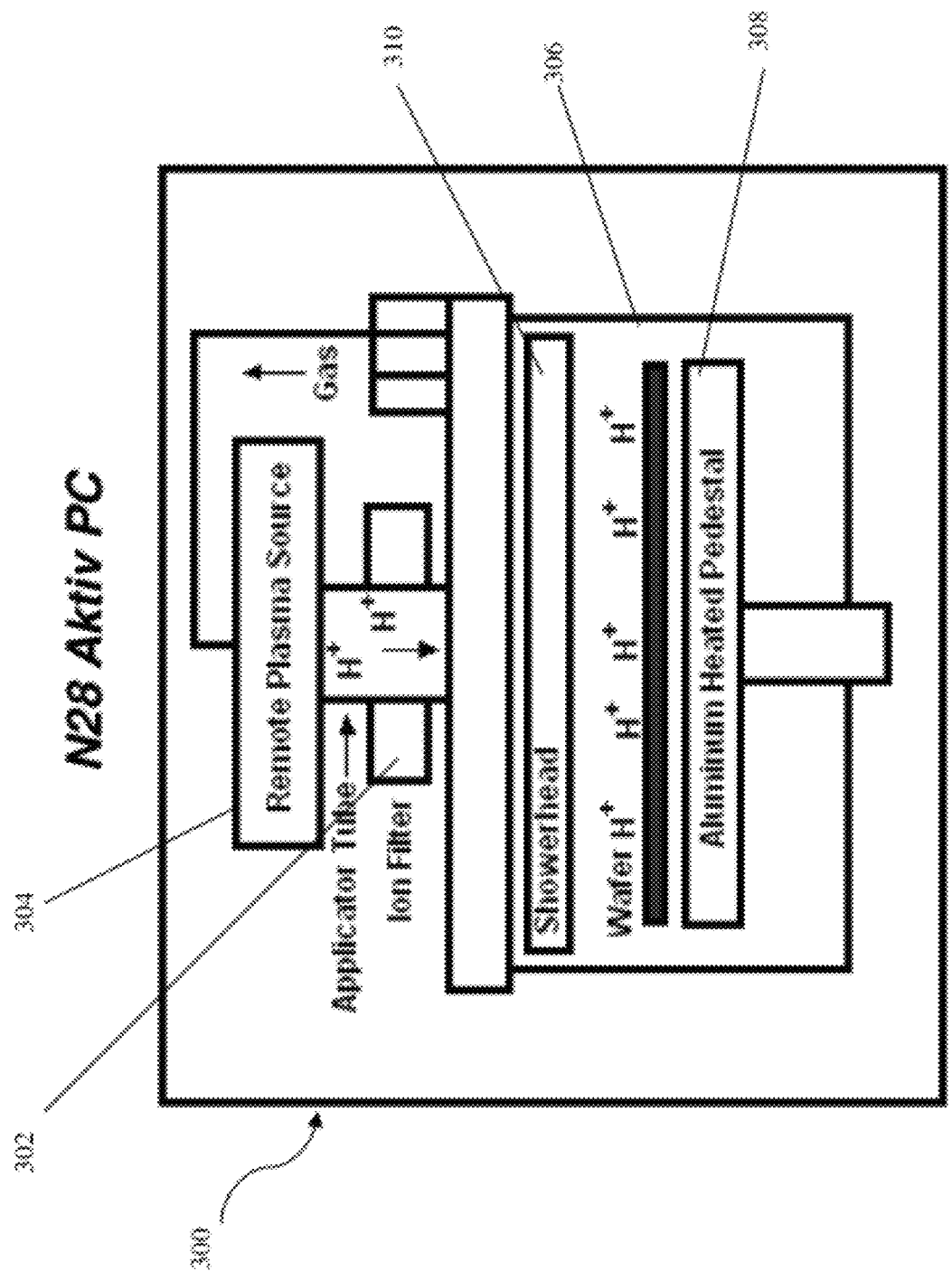
FIG. 3 illustrates an APC system for use in connection with 28 nm generation and below nodes.

As illustrated in FIG. 1, currently available thermal oxide etch rate monitors, such as a monitor 100, comprise thermal oxidation 102 approximately 1050 Å thick disposed on a silicon wafer 104 via physical vapor deposition ("PVD") and are designed for use in reactive plasma cleaning systems (RPC), such as a PC/RPC system 100 illustrated in FIG. 1. The PC/RPC system 100 is designed for use in connection with 40 nm generation and above nodes. In contrast an APC system, such as illustrated in FIG. 3 and designated by a reference numeral 300, is a remote plasma cleaning system. Damage to the substrate can be significantly reduced by cleaning with $H_2$ radicals ("H*"). As shown in FIG. 3, the APC system 300 is designed to eliminate damaging $H^+$ ions from reaching the wafer by providing an ion filter 302 between a remote plasma source 304 and a cleaning chamber 306 in which a wafer to be cleaned is disposed on a pedestal 308 beneath a showerhead 310. In contrast, in the system 200, a wafer disposed on a pedestal 202 in a cleaning chamber 203 is directly exposed to inductively coupled plasma ("ICP") from a plasma source 204 via a shower head 206.

FIG. 4 illustrates a graph 400 showing the thermal oxide etch amounts of various types of CuO pre-cleaning systems as measured over time using the monitor 100. As illustrated in FIG. 4, while the monitor 100 constitutes an appropriate monitor for pre-cleaning systems used in connection with 40 nm generation and above nodes, such as the system 200, as illustrated by sets of points 402 and 404, it is not sensitive enough to the APC system 300 to constitute an acceptable monitor for such a system, as illustrated by a set of points 406, which show an etch amount of zero.

Figure 5:
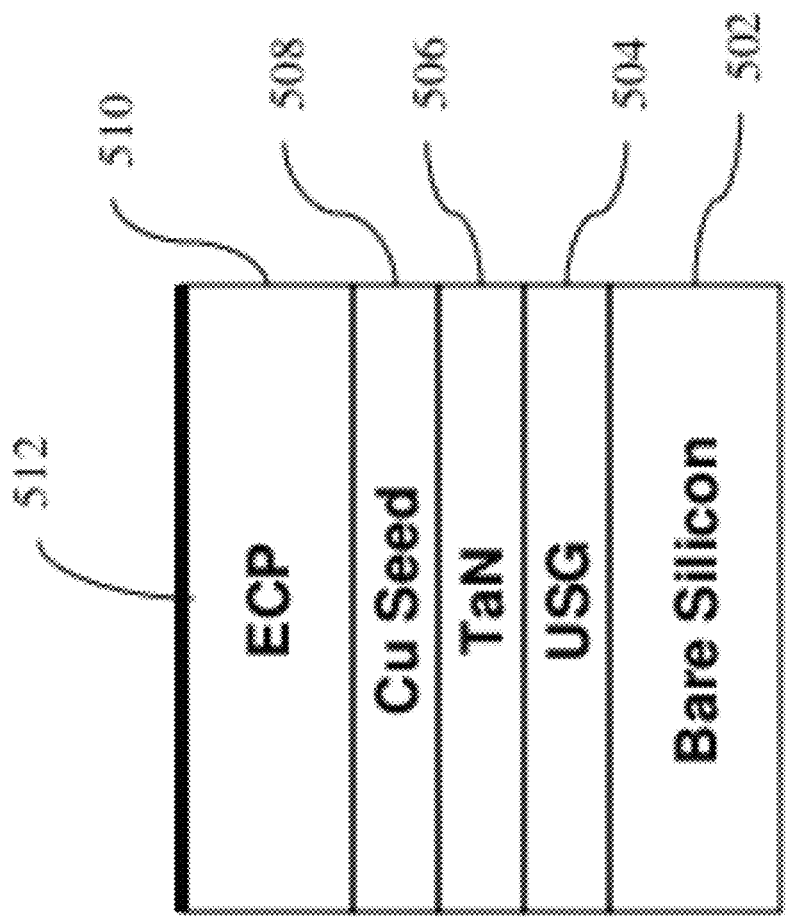
FIG. 5 illustrates a thermal oxide etch rate monitor wafer in accordance with an embodiment described herein.

Referring to FIG. 5, as will be described in detail below, the embodiments described herein provide an accurate copper oxidation monitor wafer 500 for an APC system, such as the APC system 300. In particular, the embodiments described herein create an accurate and damage-free process loop for the monitor path. As will be described in greater detail with reference to FIG. 6 below, the monitor wafer 500 comprises a bare silicon layer 502, a capping layer, which in the illustrated embodiment is an undoped silicon glass ("USG") layer 504 having a thickness of approximately 4900 Å, is disposed on the silicon layer 502, and a barrier layer 506 disposed on the USG layer 504. In one embodiment, the barrier layer comprises tantalum nitride ("TaN") and has a thickness of approximately 100 Å; however, it will be recognized that other compounds and thickness may comprise the barrier layer 506 as necessary and/or appropriate. A copper seed ("Cu seed") layer 508 having a thickness of approximately 1600 Å is disposed on the barrier layer 506 and an electrochemical plated ("ECP") copper layer 510 having a thickness of approximately 3000 Å is disposed on the Cu seed layer 508. A thin layer 512 of CuO will naturally occur on the top surface of the copper layer 510. In one embodiment, at a reflectivity ("REF") of 0.5, the CuO layer 512 will be approximately 150 Å thick and will be formed in an oxygen-rich, high temperature (e.g., equal to or greater than 300° C.) environment. In a typical embodiment, an APC process such as that performed by the system 300 can remove approximately 50 Å of CuO; therefore, after APC processing, the thickness of the CuO layer 512 will be approximately 100 Å thick (REF=0.9).

Figure 6:
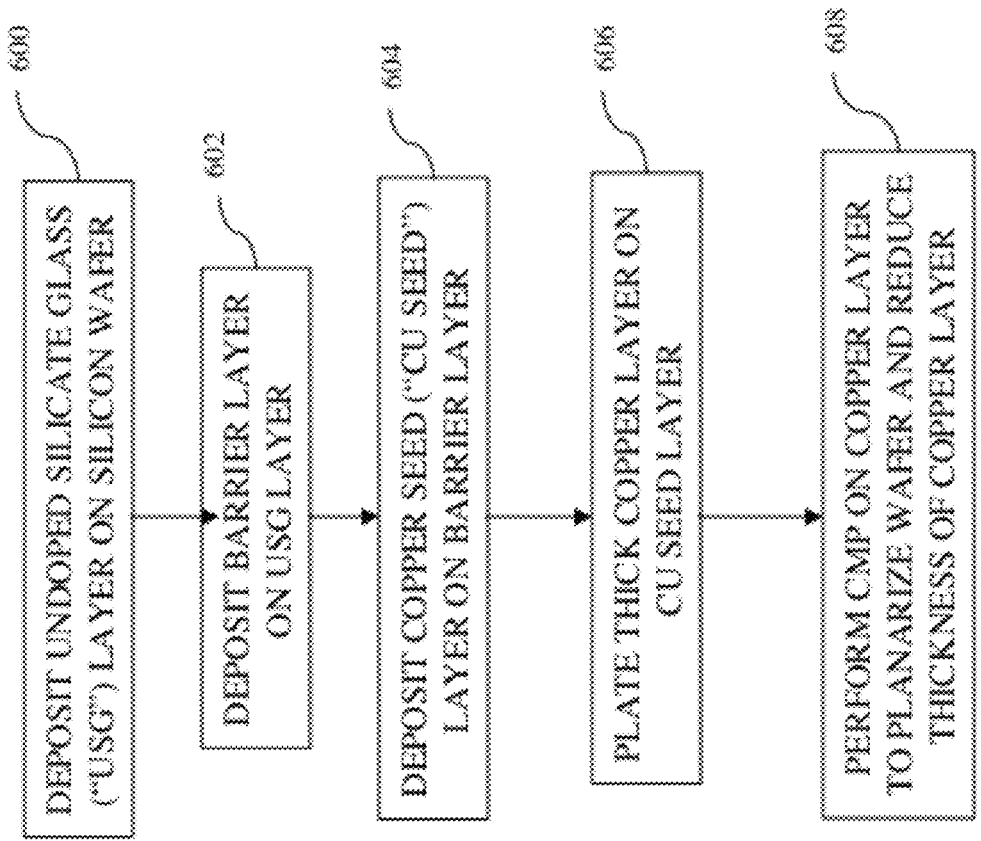
FIG. 6 illustrates a method of fabricating the monitor wafer of FIG. 5.

Referring now to FIG. 6, a method of fabricating the monitor wafer 500 will be described. In step 600, undoped silicate glass ("USG") is deposited on the silicon layer 502 using chemical vapor deposition ("CVD") or other appropriate deposition techniques to create the USG layer 504. In step 602, the barrier layer 506 is deposited on the USG layer 504 using physical vapor deposition ("PVD") or other appropriate deposition techniques. As previously noted, in one embodiment, the barrier layer comprises tantalum nitride ("TaN") having a thickness of 100 Å; however, it will be recognized that other compounds and thicknesses may be used. In step 604, a copper seeding ("Cu seed") process is performed to create the Cu seed layer 508. The Cu seed layer 508 may be deposited using PVD or other appropriate processes. In step 606, a thick (e.g., approximately 7000 Å) layer of copper is plated on the Cu seed layer 508 using an electrochemical plating ("ECP") technique. In step 608, a chemical mechanical polish ("CMP") process is performed to planarize the wafer 500 and to reduce the thickness of the copper layer 510 to approximately 3000 Å.

The resultant monitor wafer 500 has the same copper film characteristics as production wafers; accordingly, the wafer reacts to the APC in the same manner as production wafers.

Figure 7:
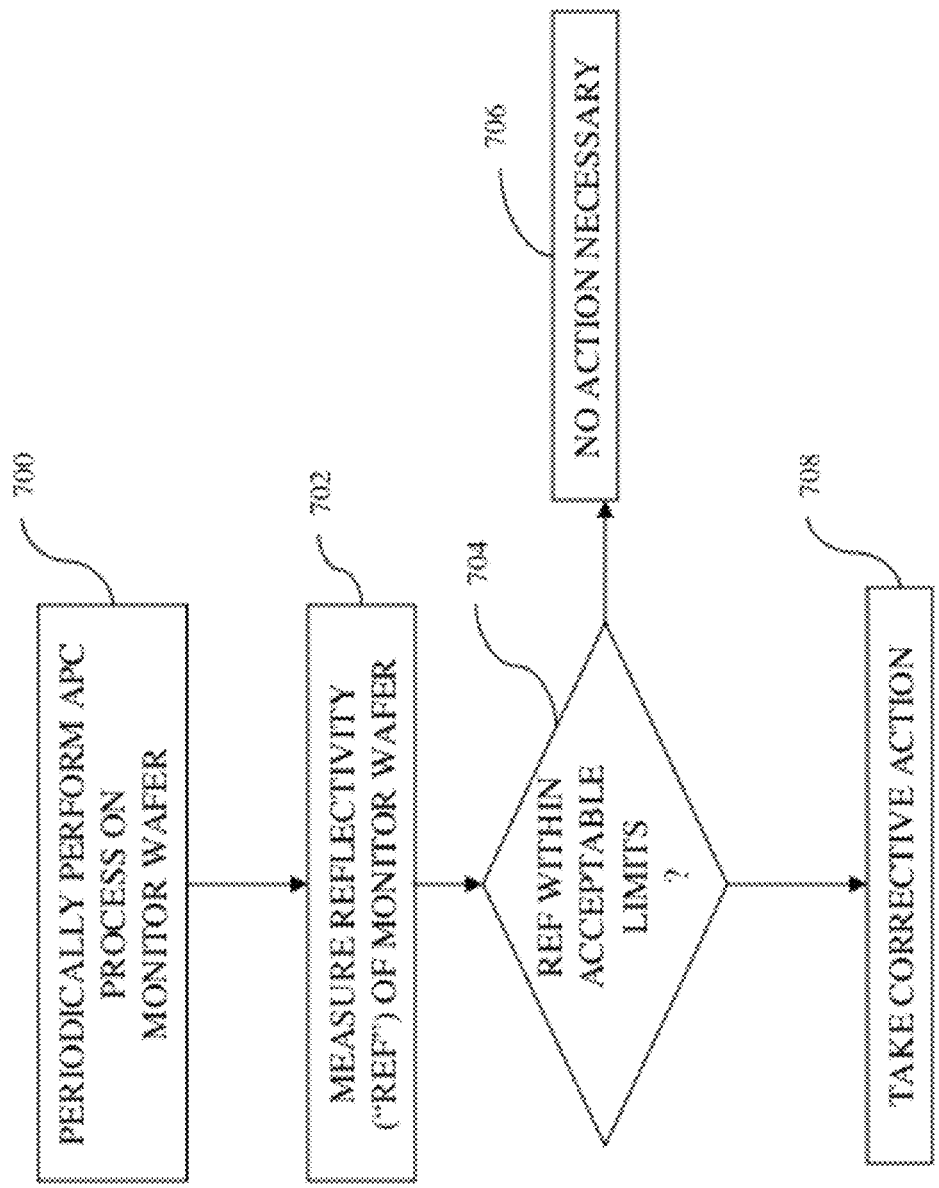
FIG. 7 illustrates a method of using the monitor wafer of FIG. 5 to monitor the thermal oxide etch rate of an APC system.
Figure 8:
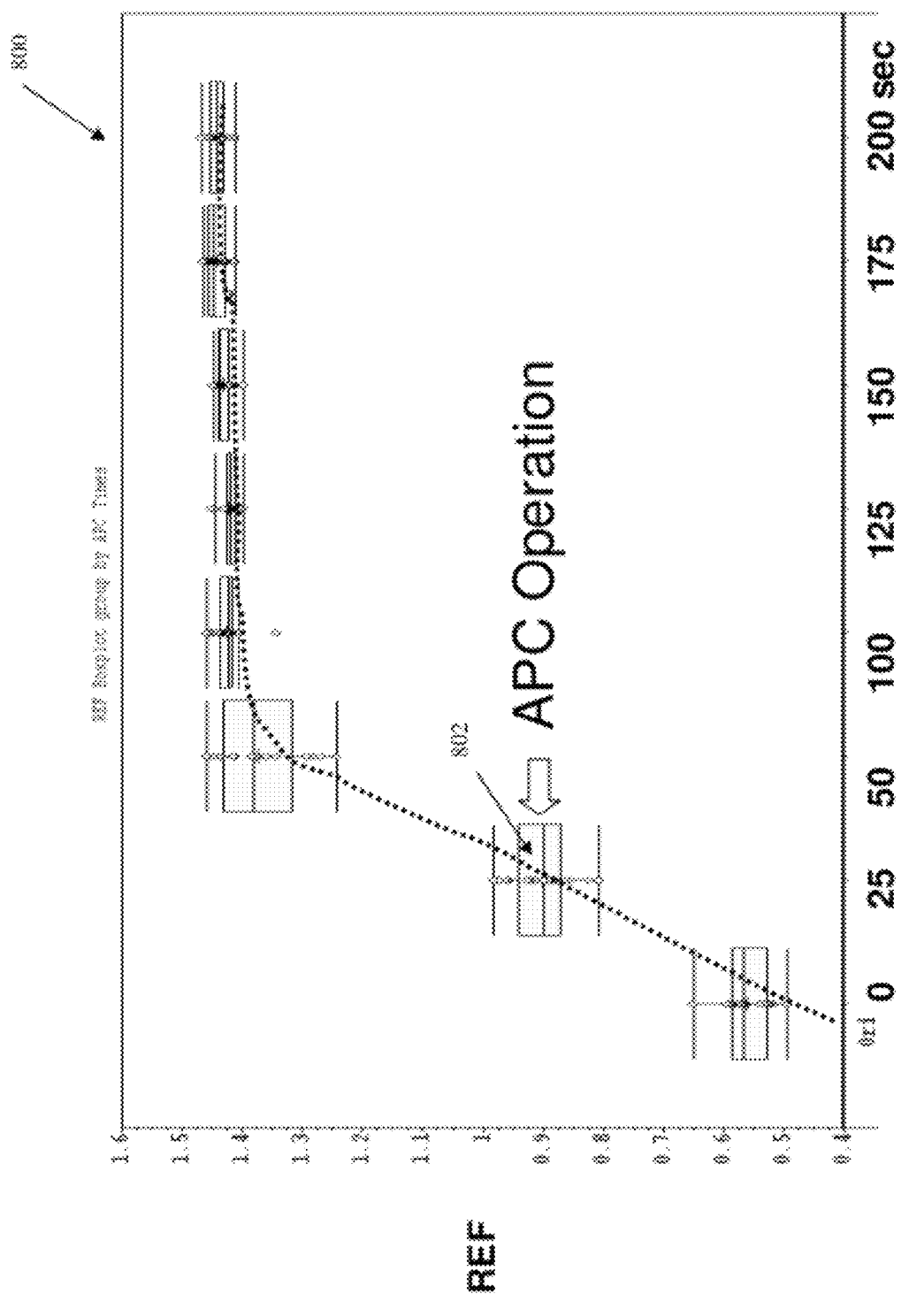
FIG. 8 is a graph illustrating the relationship between reflectivity and process time for a typical APC process.

FIG. 7 illustrates use of a monitor wafer, such as the monitor wafer 500, to monitor performance of an APC system such as the system 300. In step 700, an APC process is performed on the monitor wafer. It will be recognized that this process will also be performed, either simultaneously or sequentially, on other production and perhaps monitor wafers in a process run. After the APC process has been completed, in step 702, the reflectivity ("REF") of the monitor wafer is determined. Referring briefly to FIG. 8, a graph 800 illustrates REF values over process time (in seconds) in connection with a typical APC process. A point 802 indicates normal APC operation (e.g., REF=0.9, process time=25 seconds). Accordingly, in one embodiment, target REF is 0.9, although other targets may be adopted.

Referring again to FIG. 7, in step 704, a determination is made whether the measured REF of the monitor wafer is within acceptable limits, indicating that the APC system is functioning within spec. If it is determined in step 704 that the measured REF is within acceptable limits, in step 706, no action is necessary. In contrast, if in step 704 it is determined that the measured REF is not within acceptable limits, execution proceeds to step 708, in which corrective action may be taken. Such action may include, for example, fine tuning the etch amount (e.g., by increasing or decreasing APC process time), and addressing any hardware issues (e.g., contamination of the APC chamber, showerhead, or process kits) by replacing or repairing parts thereof. It will be recognized that all or any part of the process illustrated in FIG. 7 may be automated and performed using computer and/or other machines appropriately programmed with instructions and processors for implementing the instructions to perform the specified functions.

As a result, the monitor wafer 500 simulate production CuO for APC, overcomes the issues described above with respect to non-etchability of traditional thermal oxide wafers, such as the wafer 100, by APC, and overcomes the problem of CuO wafer peeling, as will be described One embodiment is a monitor wafer for use in monitoring a preclean process, the monitor wafer comprising a silicon base layer; a capping layer disposed on the silicon base layer; and a barrier layer disposed on the USG layer. The monitor wafer further comprises a copper ("Cu") seed layer disposed on the barrier layer; and a thick Cu layer disposed on the Cu seed layer.

Another embodiment is method of making a monitor wafer for use in monitoring a preclean process. The method comprises depositing a layer of undoped silicon glass ("USG") layer on a silicon base layer and depositing a barrier layer on the USG layer. The method further comprises depositing a copper ("Cu") seed layer on the barrier layer and creating a thick Cu layer on the Cu seed layer.

Yet another embodiment is a method of monitoring performance of an APC system. The method comprises using the APC system to perform a cleaning process on a monitor wafer, the monitor wafer comprising a thick copper layer on a top surface thereof; subsequent to the using, determining whether a reflectivity of the monitor wafer falls within acceptable limits; and responsive to a determination that the reflectivity does not fall within acceptable limits, taking corrective action.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A monitor wafer for use in monitoring a pre-clean process, the monitor wafer comprising:
   a silicon base layer;
   a capping layer disposed on the silicon base layer;
   a barrier layer disposed on the capping layer, the barrier layer contacting the capping layer;
   a copper ("Cu") seed layer disposed on the barrier layer; and
   a thick Cu layer disposed on the Cu seed layer.

2. The monitor wafer of claim 1 wherein the capping layer comprises undoped silicon glass ("USG").

3. The monitor wafer of claim 2 wherein the USG layer has a thickness of approximately 4900 Å.

4. The monitor wafer of claim 1 wherein the barrier layer comprises tantalum nitride ("TaN") having a thickness of approximately 100 Å.

5. The monitor wafer of claim 1 wherein the Cu seed layer has a thickness of approximately 1600 Å.

6. The monitor wafer of claim 1 wherein the thick Cu layer has a thickness of approximately 3000 Å.

7. The monitor wafer of claim 1 wherein the thick Cu layer is created using an electrochemical plating ("ECP") process.

8. A method of making a monitor wafer for use in monitoring a pre-clean process, the method comprising:
   depositing a layer of undoped silicon glass ("USG") layer on a silicon base layer;

depositing a barrier layer contacting the USG layer;
depositing a copper ("Cu") seed layer on the barrier layer; and
creating a thick Cu layer on the Cu seed layer.

9. The method of claim 8 wherein the USG layer has a thickness of approximately 4900 Å and wherein the creating the USG layer comprises performing a chemical vapor deposition ("CVD") process.

10. The method of claim 8 wherein the barrier layer comprises tantalum nitride ("TaN") having a thickness of approximately 100 Å and wherein the creating the barrier layer comprises performing a physical vapor deposition ("PVD") process.

11. The method of claim 8 wherein the Cu seed layer has a thickness of approximately 1600 Å and is created using a PVD process.

12. The method of claim 8 wherein the creating a thick Cu layer comprises:
creating a preliminary Cu layer having a thickness of approximately 7000 Å using an electrochemical plating ("ECP") process; and
performing a chemical mechanical planaratizion ("CMP") process on the preliminary Cu layer to reduce the thickness of the preliminary Cu layer to approximately 3000 Å.

13. The method of claim 8 further comprising forming on the thick Cu layer a CuO layer by subjecting the monitory wafer to a temperature of at least 300° C. in the presence of oxygen.

14. A method of monitoring performance of an APC system, the method comprising:
using the APC system to perform a cleaning process on a monitor wafer, the monitor wafer comprising a thick copper layer on a top surface thereof;
subsequent to the using, determining whether a reflectivity of the monitor wafer falls within acceptable limits;
responsive to a determination that the reflectivity does not fall within acceptable limits, taking corrective action.

15. The method of claim 14 further comprising, prior to the using, fabricating a monitor wafer, the fabricating comprising:
depositing a layer of undoped silicon glass ("USG") layer on a silicon base layer;
depositing a barrier layer on the USG layer;
depositing a copper ("Cu") seed layer on the barrier layer; and
creating a thick Cu layer on the Cu seed layer.

16. The method of claim 15 wherein the creating a thick Cu layer comprises creating a Cu layer having a thickness of approximately 3000 Å.

17. The method of claim 16 wherein the creating a thick Cu layer having a thickness of approximately 3000 Å further comprises:
using ECP to create a Cu layer having a thickness of approximately 7000 Å; and
performing a chemical mechanical planarization process to reduce the thickness of the Cu layer to approximately 3000 Å.

18. The method of claim 14 wherein the acceptable limits comprise a reflectivity of approximately 0.9.

19. The method of claim 13 wherein the taking corrective action comprises adjusting a process time of the APC system.

20. The method of claim 13 wherein the taking corrective action comprises at least one of replacing a showerhead of the APC system and replacing a process kit of the APC system.

* * * * *